US011322380B1

(12) United States Patent
Lin et al.

(10) Patent No.: US 11,322,380 B1
(45) Date of Patent: May 3, 2022

(54) SUBSTRATE TRANSFER SYSTEM WITH TRAY ALIGNER

(71) Applicant: SKY TECH INC., Hsinchu County (TW)

(72) Inventors: Jing-Cheng Lin, Hsinchu County (TW); Jung-Hua Chang, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 0 days.

(21) Appl. No.: 17/199,313

(22) Filed: Mar. 11, 2021

(30) Foreign Application Priority Data

Nov. 20, 2020 (TW) .................................. 109140896

(51) Int. Cl.
| | |
|---|---|
| H01L 21/677 | (2006.01) |
| B65G 47/90 | (2006.01) |
| H01L 21/67 | (2006.01) |
| H01L 21/687 | (2006.01) |
| H01L 21/68 | (2006.01) |
| H01L 21/683 | (2006.01) |
| G05B 19/408 | (2006.01) |
| G05B 19/418 | (2006.01) |

(52) U.S. Cl.
CPC ........ *H01L 21/67766* (2013.01); *B65G 47/90* (2013.01); *G05B 19/408* (2013.01); *G05B 19/4183* (2013.01); *H01L 21/67265* (2013.01); *H01L 21/67294* (2013.01); *H01L 21/68* (2013.01); *H01L 21/6838* (2013.01); *H01L 21/68707* (2013.01)

(58) Field of Classification Search
None
See application file for complete search history.

(56) References Cited

U.S. PATENT DOCUMENTS

| | | | |
|---|---|---|---|
| 6,632,068 B2 * | 10/2003 | Zinger | H01L 21/67386 414/800 |
| 11,222,802 B1 * | 1/2022 | Huang | H01L 23/04 |
| 2002/0099470 A1 * | 7/2002 | Zinger | H01L 21/67769 700/228 |
| 2010/0111650 A1 * | 5/2010 | Quach | H01L 21/67751 414/221 |
| 2017/0067163 A1 * | 3/2017 | Papasouliotis | C23C 16/45544 |

* cited by examiner

*Primary Examiner* — Gerald McClain
(74) *Attorney, Agent, or Firm* — Chun-Ming Shih; HDLS IPR Services

(57) ABSTRACT

The present disclosure relates to a substrate transfer system, which includes a main body, a tray cassette base, a tray aligner, a tray robot, a substrate cassette base, a substrate aligner, a substrate robot and a Bernoulli robot. The tray can be transferred to the tray aligner by the tray robot. The substrate can be transferred to the substrate aligner by the substrate robot. By the Bernoulli robot, the substrate can be transferred from the substrate aligner to the tray on the tray aligner.

20 Claims, 2 Drawing Sheets

SUBSTRATE TRANSFER SYSTEM WITH TRAY ALIGNER

BACKGROUND

1. Technical Field

The present disclosure relates to a substrate transfer system, in particular to a substrate transfer system that transfers a substrate to a tray through a tray robot, a substrate robot, and a Bernoulli robot in an automated manner.

2. Description of Related Art

In the integrated circuit industry, 4-inch or 6-inch wafers are often used as a substrate. In some 4-inch or 6-inch fabs, semi-automated processes are adopted. For example, before the main process is performed on the substrate, the operator often manually places the substrate in the tray, and then the tray carrying the substrate is transferred into the chamber of the machine for subsequent processes. However, the semi-automated process is not only time-consuming and labor-intensive, and the substrate is also prone to be misaligned, contaminated or even fragmented, resulting in poor product yields or incurring excess costs. Furthermore, manual transfer cannot record transfer information (event log), so when it is necessary to track the historical process of the substrate, it is difficult to obtain information, thereby increasing the difficulty of debugging the historical process of the substrate.

SUMMARY

In order to overcome the shortcomings of the conventional technology, an embodiment of the present disclosure provides a substrate transfer system, which replaces the manual transfer process of the substrate through an automated process.

The substrate transfer system can transfer a tray from a tray cassette to a tray aligner through a tray robot, and transfer a substrate from a substrate cassette to a substrate aligner through a substrate robot. Furthermore, a Bernoulli robot can transfer the substrate rotated to a predetermined angle to the tray rotated to a specific angle. In this way, automated processes can replace manual processes, thus reducing the rate of errors during transmission, and reducing the probability of contamination or fragmentation of the substrate.

According one objective of the present disclosure, an embodiment of the present disclosure provides a substrate transfer system comprising a main body, a tray cassette base, a tray aligner, a tray robot, a substrate cassette base, a substrate aligner, a substrate robot and a Bernoulli robot. The main body has a substrate picking-and-placing area and a transfer area. The tray cassette base is connected to the transfer area and used to fix a tray cassette. The tray aligner is located within the transfer area and used to rotate a tray to a first specific angle according to a first positioning block on the tray. The tray robot is located within the transfer are, used to transfer the tray from the tray cassette to the tray aligner, and used to transfer the tray from the tray aligner to the tray cassette. The substrate cassette base is located within the substrate picking-and-placing area and used to fix at least one substrate cassette. The substrate aligner is located within the transfer area and used to rotate a substrate to a predetermined angle according to a second positioning block on the substrate. The substrate robot is located within the transfer area, used to transfer the substrate from the substrate cassette to the substrate aligner, and used to transfer the substrate from the substrate aligner to the substrate cassette. The Bernoulli robot is located within the transfer area, used to transfer the substrate from the substrate aligner to the tray on the tray aligner, and used to transfer the substrate from the tray on the tray aligner to the substrate aligner. After the Bernoulli robot transfers the substrate from the substrate aligner to the tray on the tray aligner, the tray aligner rotates the tray to a second specific angle.

Optionally, the substrate transfer system further comprises a substrate cassette sensor (placement sensor) and a tray cassette sensor (placement sensor). The substrate cassette sensor is located within the substrate picking-and-placing area and used to detect whether the substrate cassette is correctly disposed on the substrate cassette base. The tray cassette sensor is connected to the transfer area and used to detect whether the tray cassette is correctly disposed on the tray cassette base.

Optionally, the substrate transfer system further comprises a substrate displacement sensor (slide sensor) and a tray displacement sensor (slide sensor). The substrate displacement sensor is located within the substrate picking-and-placing area and used to detect whether the substrate in the substrate cassette protrudes the substrate cassette. The tray displacement sensor is located within the transfer area and used to detect whether the tray in the tray cassette protrudes the tray cassette.

Optionally, the substrate transfer system further comprises a barcode reader. The barcode reader is located within the substrate picking-and-placing area and used to reading a barcode on the substrate cassette to determine a type of the substrate cassette.

Optionally, the substrate robot has a substrate mapping function. Before the substrate is transferred to the substrate aligner from the substrate cassette, the substrate robot vertically displaces in respect to substrate cassette, so as to know a number and a location of the substrate by using the substrate mapping function.

Optionally, the tray robot has a tray mapping function. Before the tray is transferred to the tray aligner from the tray cassette, the tray robot vertically displaces in respect to tray cassette, so as to know a number and a location of the tray by using the tray mapping function.

Optionally, when the substrate transfer system has multiple substrate cassette bases, the substrate cassette bases are arranged in an adjacent allocation or a vertical allocation.

Optionally, the substrate transfer system further comprises a load lock. The load lock is connected to the transfer area, wherein the tray robot transfers the tray from the tray aligner to the load lock, and transfers the tray from the load lock to the tray aligner.

Optionally, the substrate transfer system further has a cooling area connected to the transfer area, the tray robot transfers the tray from the load lock to the cooling area to cool down the substrate on the tray, and the tray robot transfers the tray from the cooling area to the tray aligner.

Optionally, the substrate transfer system further comprises a tray optical character recognition (OCR) and a substrate OCR. The tray OCR is connected to the transfer area and used to recognize a coding number on the tray. The substrate OCR is connected to the transfer area or the substrate picking-and-placing area and used to recognize a coding number on the substrate.

Optionally, the substrate transfer system further comprises a lens. The lens is connected to the transfer area and used to capture an image of the tray.

In short, the substrate transfer system provided by the embodiment of the present disclosure can use the tray robot, the substrate robot and the Bernoulli robot to transfer substrate in an automated manner, so as to improve production efficiency and reduce the rate of error. Thus, the present disclosure has advantages over the market of the demands on automated transfer (for example, integrated circuit market).

In order to make the above and other objectives, features and advantages of the present disclosure more comprehensible, with the accompanying drawings, a detailed description is given as follows.

DESCRIPTION OF THE EXEMPLARY EMBODIMENTS

To understand the technical features, content and advantages of the present disclosure and its efficacy, the present disclosure will be described in detail with reference to the accompanying drawings. The drawings are for illustrative and auxiliary purposes only and may not necessarily be the true scale and precise configuration of the present disclosure. Therefore, the scope of the present disclosure should not be limited to the scale and configuration of the attached drawings.

Figure 1:
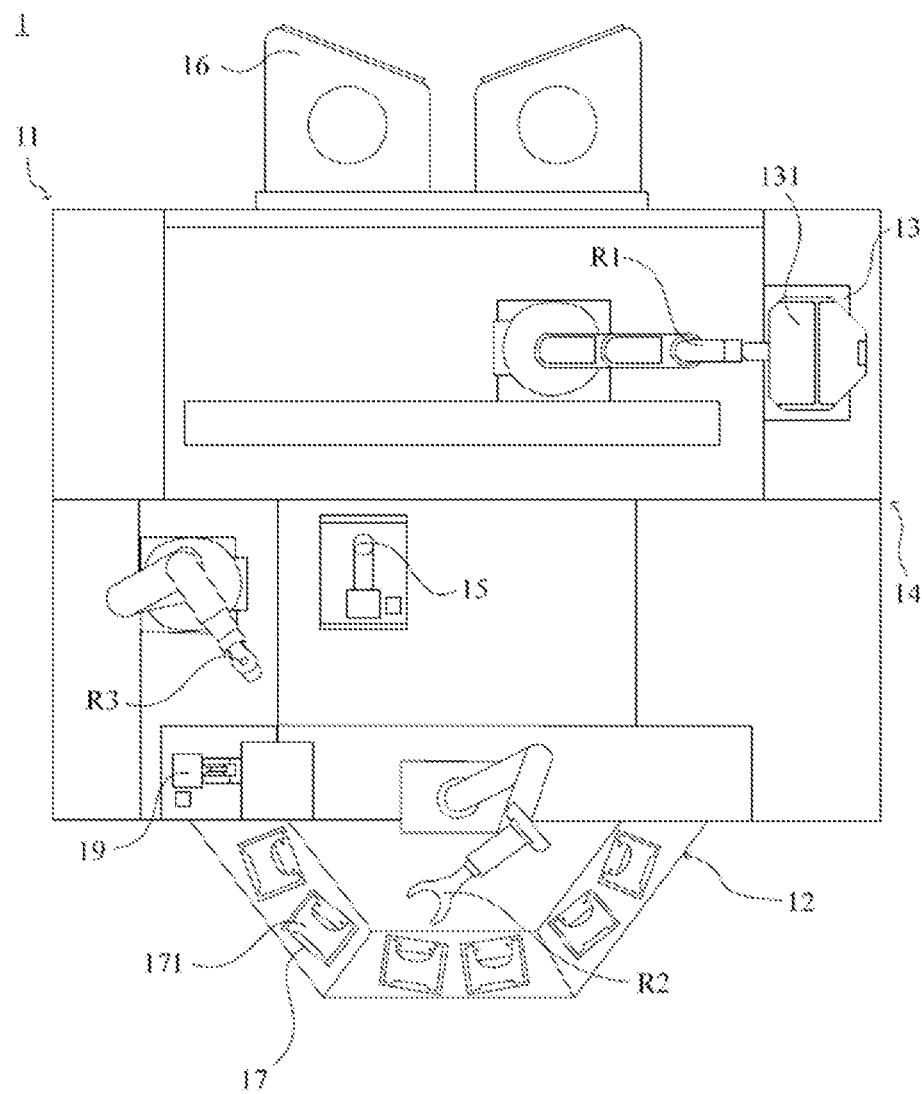
FIG. 1 is a schematic diagram of a substrate transfer system according to one embodiment of the present disclosure.
Figure 2:
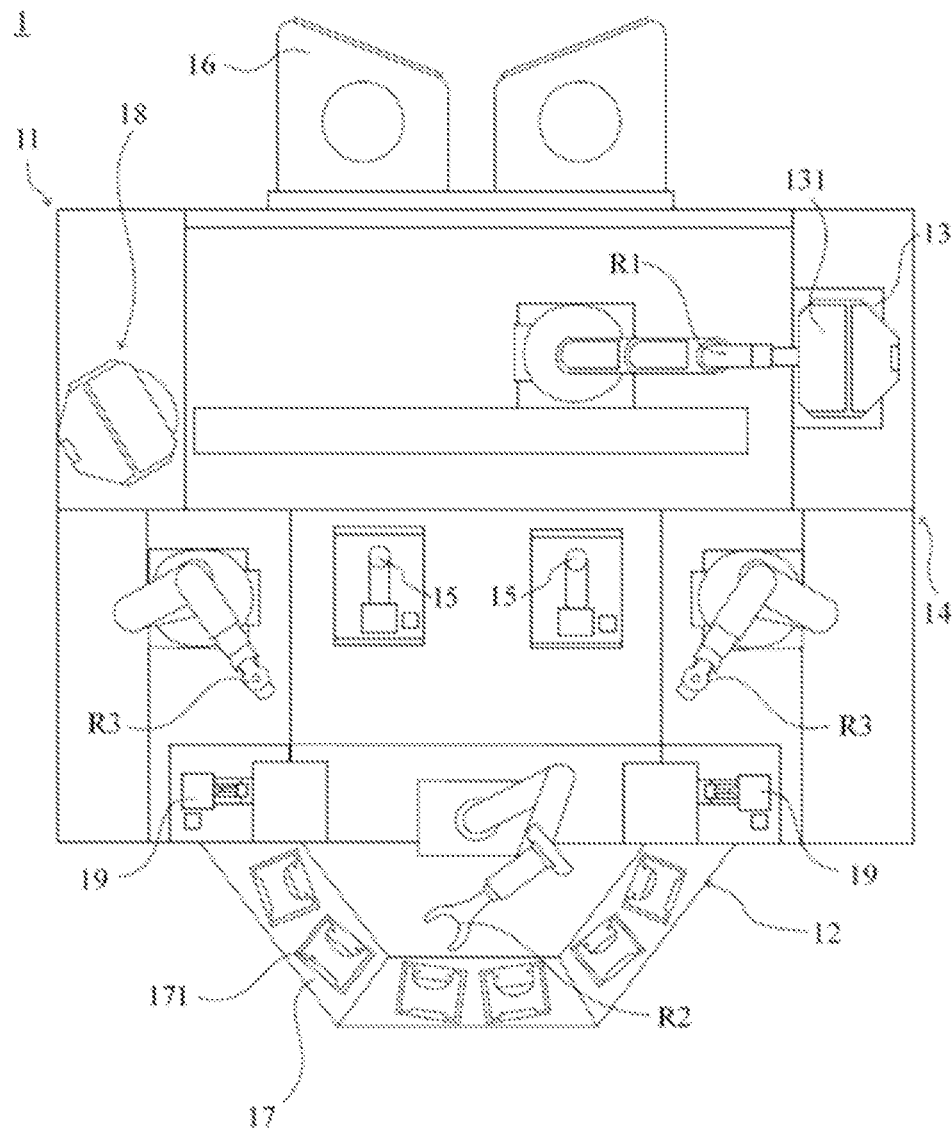
FIG. 2 is a schematic diagram of a substrate transfer system according to another one embodiment of the present disclosure.

Refer to FIG. 1 and FIG. 2, FIG. 1 is a schematic diagram of a substrate transfer system according to one embodiment of the present disclosure, and FIG. 2 is a schematic diagram of a substrate transfer system according to another one embodiment of the present disclosure. The present disclosure provides a substrate transfer system 1 comprising a main body 11, a tray cassette base 13, a tray aligner 15, a substrate cassette base 17, a substrate aligner 19, a tray robot R1, a substrate robot R2 and a Bernoulli robot R3, wherein a number of each of the tray cassette base 13, the tray aligner 15, the substrate cassette base 17, the substrate aligner 19, the tray robot R1, the substrate robot R2 and the Bernoulli robot R3 installed in the substrate transfer system 1 can be one or more than one, and there is no restriction on the positions set of the same components, for example, a pairwise symmetry arrangement or no specific arrangement.

Specifically, the main body 11 includes a substrate picking-and-placing area 12 and a transfer area 14 connected to each other. The tray cassette base 13 is connected to the transfer area 14, and the tray aligner 15, the substrate aligner 19, the tray robot R1, the substrate robot R2 and the Bernoulli robot R3 are located within the transfer area 14. The substrate cassette base 17 is located within the substrate picking-and-placing area 12.

The tray cassette base 13 is used to fix the tray cassette 131. When there are multiple tray cassette bases 13, each tray cassette base 13 can fix a tray cassette 131.

Specifically, the substrate transfer system 1 also includes a tray cassette sensor (placement sensor) (not shown) and is connected to the tray cassette base 13 to detect whether the tray cassette 131 is correctly placed in the tray cassette base 13. For example, when the detection result shows that the tray cassette 131 is correctly placed in the tray cassette base 13, the substrate transfer system 1 can obtain information, and the tray cassette base 13 and the tray cassette 131 can be locked to each other so that the tray 131 will not fall off. Or, when the detection result shows that the tray cassette 131 is not properly placed in the tray cassette base 13, the substrate transfer system 1 can send a warning message to remind the user.

The substrate transfer system 1 may also include a tray displacement sensor (slide sensor) (not shown) and located within the transfer area 14. When the tray cassette 131 is placed in the tray cassette base 13, the tray displacement sensor can detect whether the tray in the tray cassette 131 protrudes from the tray cassette 131. For example, if the tray displacement sensor detects that the tray protrudes from the tray cassette 131, the substrate transfer system 1 can send a warning message to remind the user, so as to prevent the tray from falling or being hit.

The substrate transfer system 1 may also include a tray optical character recognition (OCR) and a lens (such as, CCD) (not shown), and the tray OCR and the lens are both connected to the transfer area 14. The tray OCR is used to read and recognize a coding number on the tray to avoid using the wrong tray. When event log tracing is required, it is possible to select the substrate transfer system 1 to adopt SECS/GEM (SEMI Equipment Communication Standard/Generic Equipment Model), and the historical information of the tray can be inquired according to the coding number of the tray to be tracked. This is beneficial to the follow-up tracking and debugging of the previous process. The lens is used to obtain an image of the tray to detect defects on the tray (for example, whether the tray is back-plated), so as to help understand whether the tray can be reused.

The substrate cassette base 17 is used to fix the substrate cassette 171. When there are multiple substrate cassette bases 17, each substrate cassette base 17 can fix one substrate cassette 171, and the substrate cassette bases 17 may be arranged adjacently or vertically. Or, the substrate cassette bases 17 are arranged adjacently and vertically.

Specifically, the substrate transfer system 1 may also include a substrate cassette sensor (placement sensor) (not shown), located in the substrate picking-and-placing area 12 (for example, connected to the substrate cassette base 17), and used to detect whether the substrate cassette 171 is correctly placed in substrate cassette base 17. For example, when the detection result shows that the substrate cassette 171 is correctly placed on the substrate cassette base 17, the substrate transfer system 1 can obtain information, and the substrate cassette base 17 and the substrate cassette 171 can be locked to each other so that the substrate cassette 171 will not fall off. Or, when the detection result shows that the substrate cassette 171 is not properly placed in the substrate cassette base 17, the substrate transfer system 1 can send a warning message to remind the user.

The substrate transfer system 1 may also include a barcode reader (not shown), located in the substrate picking-and-placing area 12, and used to read the barcode on the substrate cassette 171 to distinguish the type of the substrate cassette 171. For example, the substrate cassette 171 can be classified into different types according to different process attributes. When the barcode reader determines that the barcode on the substrate cassette 171 is the target type, the substrate cassette base 17 and the substrate cassette 171 can be locked to each other. Or, when the barcode reader determines that the barcode on the substrate cassette 171 is not the target type, the substrate transfer system 1 can send out a warning message to remind the user. In this way, the wrong substrate can be prevented from being misused.

The substrate transfer system 1 may also include a substrate displacement sensor (slide sensor) (not shown) and is located in the substrate picking-and-placing area 12. After the substrate cassette 171 is placed on the substrate cassette base 17, the substrate displacement sensor can detect whether the substrate in the substrate cassette 171 protrudes from the substrate cassette 171. For example, if the substrate displacement sensor detects that the substrate protrudes from the substrate cassette 171, the substrate transfer system 1 can issue a warning message to remind the user, which can prevent the substrate from falling or being hit.

The substrate transfer system 1 may also include a substrate OCR (not shown), and the substrate OCR and the lens are both connected to the transfer area 14, or the substrate OCR can also be connected to the substrate picking-and-placing area 12. The substrate OCR is used to read and recognize the coding number on the substrate to avoid using the wrong substrate. When historical event tracking is required, it is possible to choose whether to conducts the substrate transfer system 1 to adopt SECS/GEM. The historical information of the substrate can be searched according to the coding number of the substrate to be tracked, and this is conducive to subsequent tracking and debugging of the previous process.

Please continue to refer to FIGS. 1 and 2 to understand the transfer process of the substrate before entering the manufacturing process. When the target tray cassette 131 is placed on the tray cassette base 13, the tray cassette 131 and the tray cassette base 13 are locked to each other, and the tray displacement sensor detects whether the tray in the tray cassette 131 protrudes from the tray cassette 131. In other one embodiment, after the tray cassette 131 is placed in the tray cassette base 13, the tray cassette 131 and may not be locked with the tray cassette base 13. Then, the tray robot R1 can displace vertically in respect to the tray cassette 131, so as to know the number and position of the tray through its tray mapping function, and to confirm whether the tray is placed incorrectly (for example, whether the tray is inserted obliquely), and to recognize the coding number of the tray via the tray OCR. Further, the tray robot R1 transfers the tray from the tray cassette 131 to the tray aligner 15.

After the target substrate cassette 171 is placed on the substrate cassette base 17, the substrate cassette 171 and the substrate cassette base 17 are locked to each other, and the substrate displacement sensor detects whether the substrate in the substrate cassette 171 protrudes from the substrate cassette 171. In other one embodiment, after the substrate cassette 171 is in the substrate cassette base 17, and the substrate cassette 171 may not be locked with the substrate cassette base 17. Then, the substrate robot R2 can vertically displace in respect to the substrate cassette 171, so as to know the number and position of the substrate through its substrate mapping function, and to confirm whether the substrate is placed incorrectly (for example, whether the substrate is inserted obliquely), and to recognize the coding number of the substrate via the substrate OCR. Further, the substrate robot R2 transfers the substrate from the substrate cassette 171 to the substrate aligner 19.

Then, the tray aligner 15 can rotate the tray to the first specific angle according to the first positioning block (for example, the notch or flat edge of the tray) (not shown) on the tray, and the substrate aligner 19 can rotate the tray to the first specific angle according to the second positioning block on the substrate (for example, the notch or flat edge of the substrate) (not shown), so as to make the substrate rotate to a predetermined angle.

Further, the Bernoulli robot R3 transfers the substrate from the substrate aligner 19 to the tray on the tray aligner 15. Please note that a tray can carry multiple substrates, and the process of sending multiple substrates to the same tray can repeat the above-mentioned substrate transfer steps.

Specifically, when the Bernoulli robot R3 transfers the first substrate from the substrate aligner 19 to the tray on the tray aligner 15, the tray aligner 15 will rotate the tray carrying the first substrate to a second specific angle. Then, the next substrate that has been rotated by substrate aligner 19 is transferred by Bernoulli robot R3 to the tray on tray aligner 15, and the first substrate and the next substrate are placed in the same position relative to substrate transfer system 1 (for example, but not limited to, without considering the position of the first positioning block of the tray, the first substrate and the next substrate are placed in the 12 o'clock direction of the tray). The process of sending other substrates to the same tray can repeat the above-mentioned substrate transfer steps. Furthermore, different substrates are not restricted to be placed in the same position relative to substrate transfer system 1 (for example, but not limited to, the last substrate is placed in the middle of the tray).

For example, if the tray can hold seven substrates in total, after the Bernoulli robot R3 transfers the first substrate to the tray, the tray aligner 15 will rotate the tray carrying the first substrate by 60 degrees. Then, the next substrate that has been rotated by the substrate aligner 19 is transferred to the tray by the Bernoulli robot R3, so that the first substrate and the second substrate are placed in the same position relative to the substrate transfer system 1. Then, the tray aligner 15 will rotate the tray carrying the two substrates by 60 degrees again, and continue to place the next substrate through the Bernoulli robot R3. After placing the first six substrates in sequence, the seventh substrate is sent to the middle of the tray by the Bernoulli robot R3. Of course, the first substrate can also be transferred to the middle of the tray.

Please continue to refer to FIGS. 1 and 2. The substrate transfer system 1 also includes single one or multiple load locks 16, and the load lock 16 is connected to the transfer area 14. The tray carrying the target quantity of the substrates can be transferred from the tray aligner 15 to the load lock 16 through the tray robot R1 to perform pre-processing of the process (for example, vacuuming).

Next, please continue to refer to FIGS. 1 and 2 to understand the transfer process of the substrate after the process is completed. After the process performed on the substrate in the chamber is finished, the tray robot R1 can transfer the tray from the load lock 16 to the tray aligner 15.

Alternatively, after the process is completed, the tray carrying the substrate can be selected to be transferred to the cooling area 18 connected to the transfer area 14 for cooling according to process requirements. The cooling area 18 is, for example, but not limited to, another tray cassette 131 for providing a cooling environment.

When cooling is required, the tray carrying the substrate can be transferred from the load lock 16 to the cooling area 18 through the tray robot R1 to cool down the substrate. After the cooling is completed, the tray carrying the substrate is transferred from the cooling area 18 back to the tray aligner 15 through the tray robot R1.

When cooling is not required or the cooling is completed, the Bernoulli robot R3 transfers the substrate from the tray on the tray aligner 15 back to the substrate aligner 19.

Specifically, after the Bernoulli robot R3 transfers the first substrate from the tray on the tray aligner 15 back to the substrate aligner 19, the tray aligner 15 can rotate the tray carrying other substrates to a third specific angle. Then, after the first substrate leaves substrate aligner 19, the next substrate is transferred to substrate aligner 19 by Bernoulli robot R3, and the first substrate and the next substrate can be placed at the same position relative to substrate transfer system 1 and be taken away by Bernoulli robot R3 (for example, but not limited to, without considering the position of the first positioning block of the tray, the first substrate and the next substrate are taken away by Bernoulli robot R3 at 12 o'clock in the tray). The transfer process of other substrates can repeat the above transfer steps. Furthermore, different substrates are not restricted to be taken away from the same position relative to substrate transfer system 1 (for example, but not limited to, the first or last substrate is taken away by Bernoulli robot R3 in the middle of the tray).

Next, the substrate robot R2 transfers the substrate from the substrate aligner 19 to the substrate cassette 171. The process of transferring the substrates from the tray back to the substrate cassette 171 is the same as mentioned above.

After all the substrates are transferred from the tray back to the substrate cassette 171, the tray robot R1 transfers the tray from the tray aligner 15 to the tray cassette 131 and completes the substrate transfer process before and after the process.

Please refer to Table 1 and Table 2 to understand the advantages of the substrate transfer system 1 in the present disclosure (compared to manual transfer). Table 1 is a comparison table of substrate quality and production efficiency, and Table 2 is a comparison table of transfer accuracy and function. As shown in the tables, the substrate transfer system 1 described in the present disclosure can achieve better particle control of the substrate, and achieve a lower substrate fragmentation rate and more quantity of good dies, and can improve production efficiency. Furthermore, the accuracy of substrate placement can also be improved. The substrate transfer system 1 also has the function of substrate mapping function, historical event tracking, remote operation and support for SECS/GEM, which can reduce the transmission error rate, or facilitate the subsequent debugging of the previous process, and improve the convenience of operation.

TABLE 1

| item | substrate transfer system | manual transfer |
|---|---|---|
| particle control | better | no |
| substrate fragmentation rate | low | high |
| number of good die | many | little |
| production per hour | high | low |

TABLE 2

| Item | substrate transfer system | manual transfer |
|---|---|---|
| substrate placement accuracy | high | low |
| substrate mapping function | yes | no |
| event log tracing | yes | no |
| remote control | yes | no |
| support SECS/GEM | yes | no |

In summary, compared with the prior art, the technical effects of the substrate transfer system described in the embodiment of the present disclosure are described as follows.

In the conventional technology, the transmission of some substrates still adopts manual operations, which is prone to operational errors and difficult to control, and may cause problems such as product quality degradation or even fragmentation. In contrast, the substrate transfer system described in the present disclosure adopts an automated process to transfer the substrate, which can not only reduce the contamination rate and fragmentation rate of the substrate, but also accelerate the production efficiency, and when the historical process of the previous process must be tracked later, Information can be easily obtained.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. An substrate transfer system, comprising:
   a main body, having a substrate picking-and-placing area and a transfer area;
   at least one tray cassette base, connected to the transfer area, fixing a tray cassette;
   at least one tray aligner, located within the transfer area, rotating a tray to a first specific angle according to a first positioning block on the tray;
   at least one tray robot, located within the transfer area, transferring the tray from the tray cassette to the tray aligner, and transferring the tray from the tray aligner to the tray cassette;
   at least one substrate cassette base, located within the substrate picking-and-placing area, fixing at least one substrate cassette;
   at least one substrate aligner, located within the transfer area, rotating a substrate to a predetermined angle according to a second positioning block on the substrate;
   at least one substrate robot, located within the transfer area, transferring the substrate from the substrate cassette to the substrate aligner, and transferring the substrate from the substrate aligner to the substrate cassette; and
   at least one Bernoulli robot, located within the transfer area, transferring the substrate from the substrate aligner to the tray on the tray aligner, and transferring the substrate from the tray on the tray aligner to the substrate aligner;
   wherein after the Bernoulli robot transfers the substrate from the substrate aligner to the tray on the tray aligner, the tray aligner rotates the tray to a second specific angle.

2. The substrate transfer system according to claim 1, further comprising:
   a substrate cassette sensor, located within the substrate picking-and-placing area, detecting whether the substrate cassette is correctly disposed on the substrate cassette base.

3. The substrate transfer system according to claim 2, wherein when the substrate cassette sensor detects that the substrate cassette is correctly disposed on the substrate cassette base, the substrate cassette base and the substrate cassette are locked to each other.

4. The substrate transfer system according to claim 1, further comprising:
   a tray cassette sensor, connected to the transfer area, detecting whether the tray cassette is correctly disposed on the tray cassette base.

5. The substrate transfer system according to claim 4, wherein when the tray cassette sensor detects that the tray cassette is correctly disposed on the tray cassette base, tray cassette base and the tray cassette are locked to each other.

6. The substrate transfer system according to claim 1, further comprising:
substrate displacement sensor, located within the substrate picking-and-placing area, detecting whether the substrate in the substrate cassette protrudes the substrate cassette.

7. The substrate transfer system according to claim 1, further comprising:
a tray displacement sensor, located within the transfer area, detecting whether the tray in the tray cassette protrudes the tray cassette.

8. The substrate transfer system according to claim 1, further comprising:
a barcode reader, located within the substrate picking-and-placing area, reading a barcode on the substrate cassette to determine a type of the substrate cassette.

9. The substrate transfer system according to claim 1, wherein the substrate robot has a substrate mapping function, before the substrate is transferred to the substrate aligner from the substrate cassette, the substrate robot vertically displaces in respect to substrate cassette, so as to know a number and a location of the substrate by using the substrate mapping function.

10. The substrate transfer system according to claim 1, wherein the tray robot has a tray mapping function, before the tray is transferred to the tray aligner from the tray cassette, the tray robot vertically displaces in respect to tray cassette, so as to know a number and a location of the tray by using the tray mapping function.

11. The substrate transfer system according to claim 1, wherein when the substrate transfer system has multiple substrate cassette bases, the substrate cassette bases are arranged in an adjacent allocation or a vertical allocation.

12. The substrate transfer system according to claim 1, further comprising:
at least one load lock, connected to the transfer area, wherein the tray robot transfers the tray from the tray aligner to the load lock, and transfers the tray from the load lock to the tray aligner.

13. The substrate transfer system according to claim 12, wherein the substrate transfer system further has a cooling area connected to the transfer area, the tray robot transfers the tray from the load lock to the cooling area to cool down the substrate on the tray, and the tray robot transfers the tray from the cooling area to the tray aligner.

14. The substrate transfer system according to claim 13, wherein the cooling area is the tray cassette.

15. The substrate transfer system according to claim 1, further comprising:
a tray optical character recognition (OCR), connected to the transfer area, recognizing a coding number on the tray.

16. The substrate transfer system according to claim 1, further comprising:
a substrate OCR, connected to the transfer area or the substrate picking-and-placing area, recognizing a coding number on the substrate.

17. The substrate transfer system according to claim 1, further comprising:
a lens, connected to the transfer area, capturing an image of the tray.

18. The substrate transfer system according to claim 1, wherein the substrate transfer system adopts SEMI Equipment Communication Standard/Generic Equipment Model (SECS/GEM), so as to search history information of the substrate via a coding number of the substrate.

19. The substrate transfer system according to claim 1, wherein the first positioning block is a notch or a flat edge.

20. The substrate transfer system according to claim 1, wherein the second positioning block is a notch or a flat edge.

* * * * *